SOLENOID AND ELECTRONIC DELAY CIRCUIT

Filed Feb. 3, 1969 2 Sheets-Sheet 1

INVENTORS
IRVING L. MITCHELL
& JULIUS LEWIS

BY Hurvitz, Rose & Greene

ATTORNEYS

SOLENOID AND ELECTRONIC DELAY CIRCUIT

INVENTORS
IRVING L. MITCHELL
& JULIUS LEWIS

BY Hurvitz, Rose & Greene
ATTORNEYS

United States Patent Office 3,558,996
Patented Jan. 26, 1971

3,558,996

SOLENOID AND ELECTRONIC DELAY CIRCUIT

Irving L. Mitchell, Rockville Centre, and Julius Lewis, Oceanside, N.Y., assignors to Ebert Electronics Corp., Floral Park, N.Y., a corporation of New York Filed Feb. 3, 1969, Ser. No. 796,011
Int. Cl. H01h *45/00;* H05k *5/02*
U.S. Cl. 317—123 5 Claims

ABSTRACT OF THE DISCLOSURE

A solenoid having secured thereto an electronic delay circuit. The delay circuit is mounted on a circuit board which is supported by plastic rivets integral with a sealed container, which in turn is secured by a threaded hollow nipple to a U-shaped bracket attached at its base to the solenoid. A closure for the legs of the bracket then completes an enclosure for leads outgoing from the solenoid and circuit board.

BACKGROUND OF THE INVENTION

It is known to associate solenoids with delay circuits, both for delay on make and for delay on break. The present invention utilizes delay circuitry which is per se known, but associates the circuitry with a solenoid in an assembly which is particularly compact and economical of fabrication, and which enables easy substitution of a delay circuit sub-assembly in the assembly, for purpose of maintenance or replacement. The circuitry itself is mounted on a circuit board, which is usual, but the circuit board is mounted within a thermo-plastic enclosure, having integral internal thermo-plastic nipples which engage holes in the circuit board and are then melted over to rivet the circuit board to the container.

SUMMARY OF THE INVENTION

A solenoid and electronic delay circuit assembly, in which the assembly is mounted in a container by means of thermoplastic nipples integral with the container, the container being secured to the solenoid by means of a threaded nipple.

DESCRIPTION OF THE PREFERRED EMBODIMENTS

Figure 1:
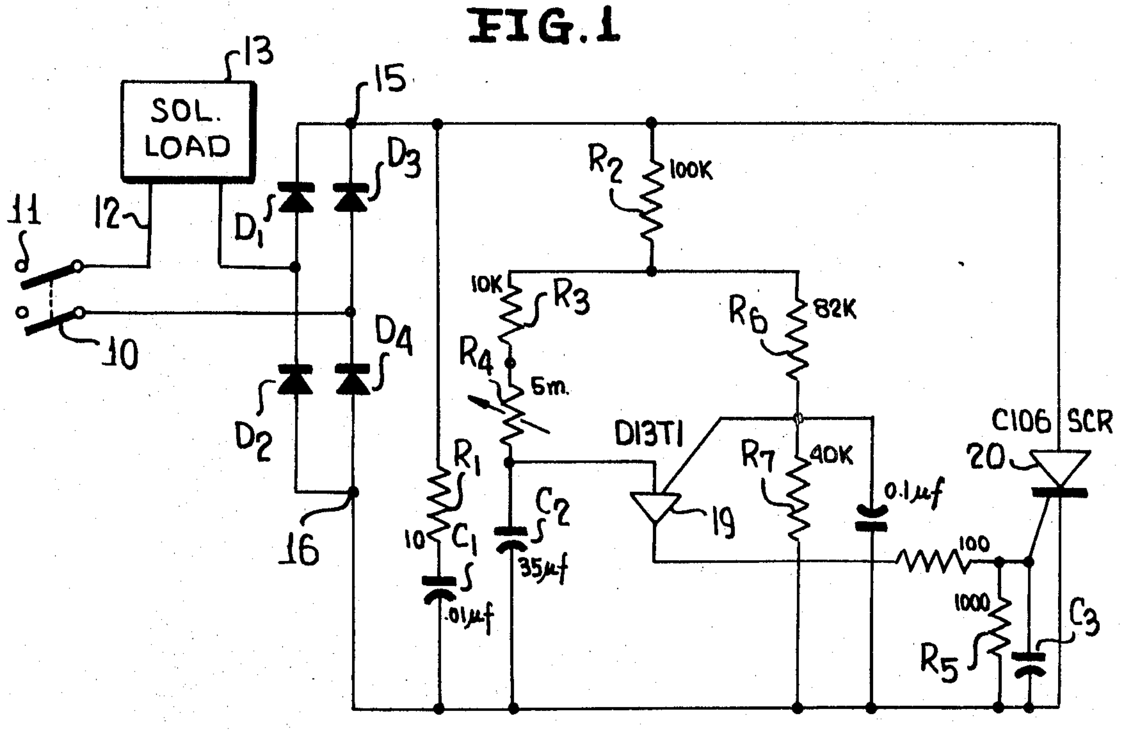
FIG. 1 is a schematic circuit diagram of a delay on make circuit.

In FIG. 1, 10 denotes a switch connectable to AC supply terminals 11. One of the supply leads 12, is connected to one side of a solenoid load 13, represented by the coil of a solenoid, and the other side of the solenoid load is connected to the anode of a diode $D_1$, and the cathode of a diode $D_2$. The other supply lead is connected directly to the anode of a diode $D_3$ and the cathode of a diode $D_4$. The cathodes of $D_1$, $D_3$, are joined at terminal 15 and the anodes of $D_2$, $D_4$ are joined at terminal 16. Between terminals 15, 16, is connected a filter comprised of resistance $R_1$ and capacitor $C_1$, so that terminals 15, 16 have filtered DC voltages thereacross when switch 10 is closed, terminal 10 being positive.

Connected in series between terminals 15 and 16 are, in the order recited, the components of a timing circuit, i.e., resistances $R_2$, $R_3$, $R_4$ and capacitor $C_2$. $R_4$ is variable to adjust timing. $C_2$ is connected to the anode terminal of a programmable unijunction transistor 19, the cathode of which is connected to a bias resistance $R_5$ and thence to terminal 16. Capacitor $C_3$ is charged during the conduction of the SCR to the voltage drop across the gate junction. A sufficiently high value capacitor maintains gate current for over 8.3 milliseconds, and hence prevents the solenoid from de-energizing when the AC current drops to zero.

Bias resistance $R_5$ is connected to the gate of an SCR 20, the anode of which is connected to terminal 15 and the cathode to terminal 16. The SCR, when unfired interrupts the circuit to the solenoid load 13, and when fired, completes this circuit. The SCR 20 is fired when sufficient voltage appears across resistance $R_5$, but once fired, conducts until switch 10 is opened.

The gate of the programmable unijunction transistor 19 is connected to a voltage divider, including resistances $R_2$, $R_6$, $R_7$, connected in series in the order recited across terminals 15, 16, the gate being connected to the tie point of $R_6$ and $R_7$.

In operation, when switch 10 is closed, voltage commences to build up across $C_2$. When this voltage attains a sufficient value, the anode to gate diode of unijunction transistor 19 becomes forward biased and the re-generation inherent in this type of transistor device causes it to conduct, thus producing a voltage across $R_5$ and firing SCR 20. The solenoid 13 is then energized. The solenoid is de-energized by opening switch 10.

Figure 2:
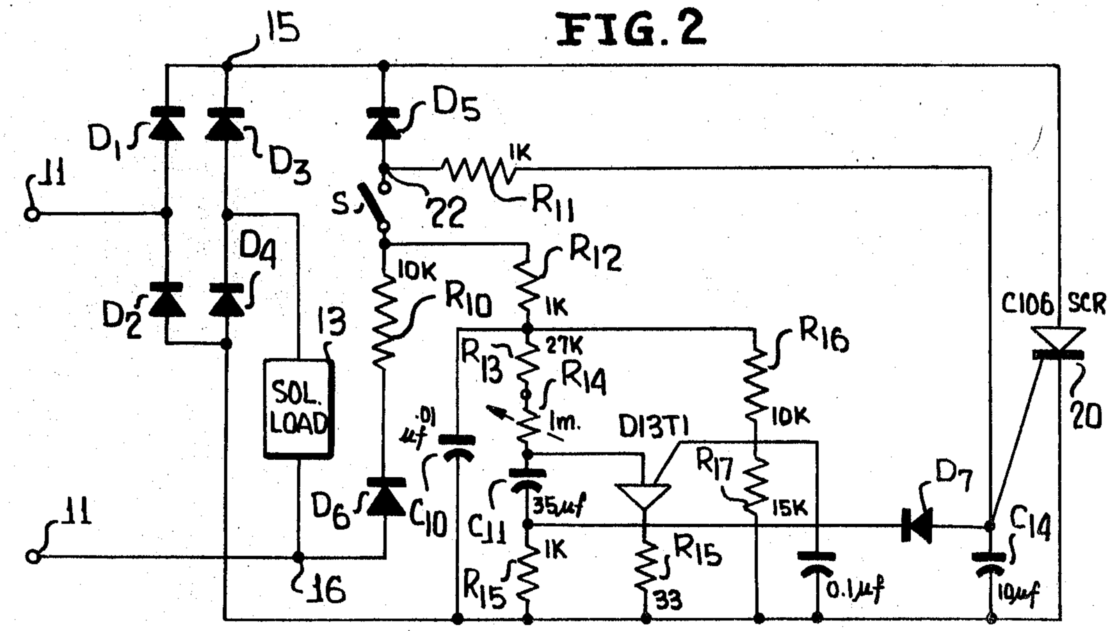
FIG. 2 is a schematic circuit diagram of a delay on break circuit.

In FIG. 2, the circuit is always connected to terminals 11, and solenoid load 13 is connected between the junction of $D_3$, $D_4$ and terminal 16. On closing switch S, the solenoid load 13 is immediately energized, i.e., SCR 20 is immediately fired. On opening switch S, the SCR 20 blocks after a time delay, and the solenoid is de-energized.

The switch S is in a circuit consisting, in the order named, and starting from terminal 15, of the cathode-anode of a diode $D_5$, switch S, current limiting resistance $R_{10}$, cathode-anode of a diode $D_6$. When switch S is closed and terminal 16 goes into a positive half cycle, positive voltage is transferred through $D_6$, $R_{10}$, S, resistance $R_{11}$ to the gate of SCR 20, which fires, energizing load 13, and charging capacitor $C_{14}$, which retains its charge. This condition remains until S is opened. DC positive voltage is stored in capacitor $C_{10}$, through $D_6$, when switch S is open, $C_{10}$ being a filter capacitor, and $D_6$ providing rectification. The charging circuit for $C_{11}$ is composed of resistances $R_{10}$, $R_{12}$–$R_{15}$, of which $R_{14}$ is adjustable and large, and this charging circuit is exclusive of switch S.

The gate of programmable unijunction transistor 19 is biased at the tie point of resistances $R_{16}$, $R_{17}$. So long as switch S is open, almost the full voltage available at terminal 16 is applied to charging capacitor $C_{10}$ until eventually unijunction 19 is fired. When S is closed both capacitors $C_{10}$ and $C_{11}$ are nearly short-circuited by the SCR.

When S is opened $C_{10}$ and $C_{11}$ start to charge. $C_{10}$ having a low time constant charges nearly immediately to its full voltage during the half cycles when terminal 16 is positive. $C_{11}$ starts to charge slowly depending on the resistance of $R_{14}$. $C_{11}$ cannot discharge because $D_7$ is reverse biased.

When the anode voltage of the programmable unijunction transistor exceeds the gate voltage by about 0.5 volt, the programmable unijunction transistor conducts. This discharges capacitor $C_{11}$ immediately. The potential of the plate of $C_{11}$ which had some definite positive value in respect to the ground drops to nearly zero. As the voltage between capacitor plates cannot change instantly (due to the high capacitance) the lower plate potential turns negative. The $D_7$ diode is now forward biased and capacitor $C_{14}$ discharges. SCR cannot be re-conducting in the next cycle. As such, the SCR blocks and the solenoid is turned off.

Figure 3:
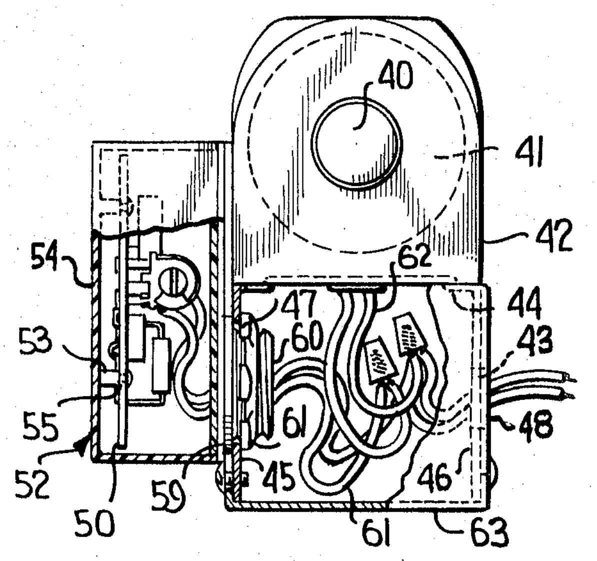
FIG. 3 is a side view partly broken away, of an assembly according to the invention, and including one of the circuits of FIG. 1 and FIG. 2.
Figures 4, 5:
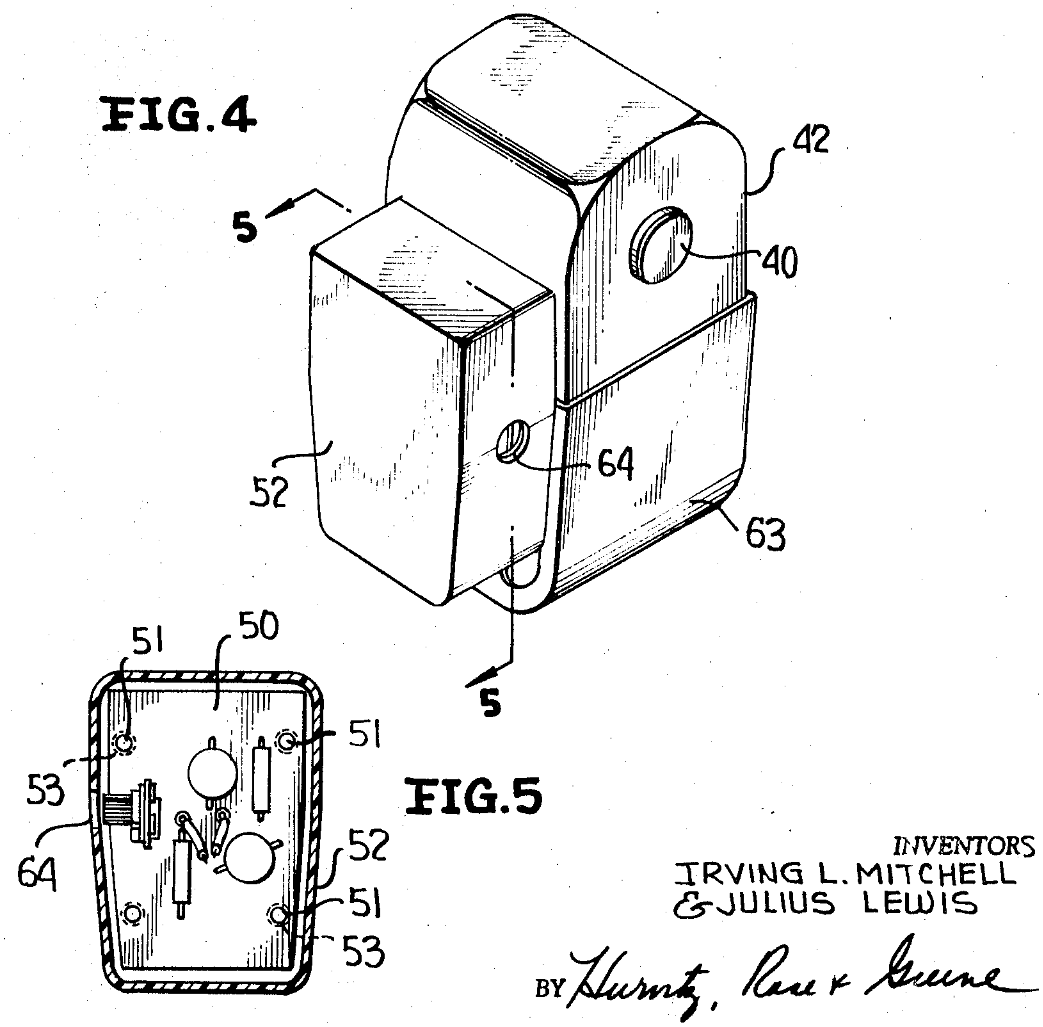
FIG. 4 is a view in perspective of an assembly according to the invention.
FIG. 5 is a view in section taken through a circuit board and its mounting.

The wiring illustrated in FIG. 3 pertains to a delay on armature core 40. The latter may operate a valve (not shown) for example, when pulled into the opening. The core and coil are contained in a metal case 42, and are potted.

Extending from the case 42 is a U-shaped bracket 43, having a base 44 secured to the metal case 42 by means of suitable tabs. The arms 45, 46 of the U-shaped bracket each contains an opening 47, 48, through which leads may be taken and one of which also serves to mount a circuit box, containing either the circuit of FIG. 1, or the circuit of FIG. 2, or some other suitable circuit, to effect delayed action.

The circuit is mounted on a rectangular circuit board 50, having four holes 51 near the corners of the board. A thermo-plastic container 52 has one side open, and four nipples 53 upstanding from the base 54, at positions to accept the holes 51. Each nipple has a shoulder 55, on which the circuit board rests, and the pins above the shoulders are longer than the board is thick. The pins then extend beyond the board when the latter is mounted on the shoulders. The pins being integral with the container, and being thermo-plastic, are heated to melt their ends, and when so melted, they flow over the circuit board and act as rivets to secure the board firmly in the container.

A closure 59 is secured adhesively to the open container, to provide a closed container. From the latter extends a threaded hollow nipple 60, which enables two leads 61 to be withdrawn from the container. The nipple 60 extends through opening 47, and a nut 61 secures the nipple to the arm 45. These leads 61 correspond with appropriate terminals of FIG. 1, and are connected in series with line to lead 62 extending to the core of the solenoid. Opening 48 then enables a power cord to be connected, as indicated in FIG. 3. For delay on break units, FIG. 2, five (5) wires extend through nipple 60 and opening 47 and are wired as indicated in FIG. 3.

A U-shaped metallic cover 63 fits over the arms of the bracket to complete a closure for the entire system, so that no wiring except the power leads are exposed.

An opening 64 is provided in a wall of the container through which a timing adjustment may be made, as by slotted knob 65, actuable by means of a screw driver. In this respect, each delay circuit includes only one adjustment, at $R_4$ in FIG. 1 and at $R_{14}$ in FIG. 2.

Should the delay circuits prove defective, in use, a replacement unit can be readily mounted without disturbing the solenoid itself, or a delay on make circuit may be substituted for a delay on break circuit, if desired. The assembly is economical to fabricate, and is compact and free of external wiring. Different types of delay units can be assembled to a given solenoid, either at the factory or at an installation.

The wiring illustrated in FIG. 3 pertains to a delay on make arrangement. It is within the skill of the ordinary engineer to modify the connections for delay in break operation, and therefore further illustration is not provided.

What is claimed is:

1. A solenoid comprising an electro-magnet having a transverse operating aperture, a U-shaped bracket extending from said electro-magnet, said U-shaped bracket having a base adjoined to said electro-magnet, said base having an opening through which extends energizing leads for said electro-magnet, said U-shaped bracket further including two legs extending from said base, a circuit box having a cover provided with a hollow externally extending threaded nipple, one of said legs of said U-shaped bracket having an opening through which said threaded nipple extends, internally of said U-shaped bracket, a nut threadedly securing said threaded nipple to said one of said legs, said circuit box being fabricated of thermo-plastic material and having plural internal nipples, a circuit board having openings through which said nipples extend, said nipples being melted over to rivet said circuit board to said box internally of said box, and means sealing said cover to said box, said hollow nipple providing an opening into said box through which leads to said circuit board extend.

2. The combination according to claim 1, wherein is provided a U-shaped cover secured to the edges of said legs.

3. The combination according to claim 2, wherein a delay circuit is mounted on said circuit board, said delay circuit including an SCR connected in series with said electro-magnet, means firing said SCR to energize said electro-magnet and defiring said SCR to de-energize said electro-magnet, and means controlling one of the firing and defiring following a time delay.

4. The combination according to claim 3, wherein said last means is a means to introduce a time delay preceding firing of said SCR in response to actuation of a switch.

5. The combination according to claim 3, wherein said last means is a means to introduce a time delay preceding defiring of said SCR in response to actuation of a switch.

References Cited

UNITED STATES PATENTS

| | | | |
|---|---|---|---|
| 3,353,068 | 11/1967 | Turk | 317—99 |
| 3,432,727 | 3/1969 | Bassani | 317—99 |

LEE T. HIX, Primary Examiner

U.S. Cl. X.R.

317—123, 142; 174—52